US010319631B2

(12) United States Patent
Bayerer

(10) Patent No.: US 10,319,631 B2
(45) Date of Patent: Jun. 11, 2019

(54) PARALLEL PLATE WAVEGUIDE FOR POWER SEMICONDUCTOR PACKAGE

(71) Applicant: Infineon Technologies AG, Neubiberg (DE)

(72) Inventor: Reinhold Bayerer, Reichelsheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/993,173

(22) Filed: May 30, 2018

(65) Prior Publication Data

US 2018/0286745 A1   Oct. 4, 2018

Related U.S. Application Data

(62) Division of application No. 15/380,722, filed on Dec. 15, 2016, now Pat. No. 10,008,411.

(51) Int. Cl.
*H01L 21/768*   (2006.01)
*H01L 23/367*   (2006.01)
(Continued)

(52) U.S. Cl.
CPC .. *H01L 21/76838* (2013.01); *H01L 21/76877* (2013.01); *H01L 23/367* (2013.01);
(Continued)

(58) Field of Classification Search
CPC .............. H01L 21/76838; H01L 21/76877
(Continued)

(56) References Cited

U.S. PATENT DOCUMENTS 4,490,626 A   12/1984   Carlson
4,514,649 A   4/1985   Nuzillat
(Continued)

FOREIGN PATENT DOCUMENTS

DE   102007024413 A1   12/2007
DE   102007058556 A1   6/2008
(Continued)

OTHER PUBLICATIONS

Bayerer, Reinhold, "Parasitic inductance hindering utilization of power devices", 9th International Conference on Integrated Power Electronics Systems, Proceedings of CIPS 2016, Mar. 8-10, 2016, pp. 1-8.
(Continued)

*Primary Examiner* — David Vu
*Assistant Examiner* — Brandon C Fox
(74) *Attorney, Agent, or Firm* — Murphy, Bilak & Homiller, PLLC

(57) ABSTRACT

A power semiconductor package includes a first group of semiconductor dies attached to a first side of a substrate and evenly distributed over a width of the substrate and a second group of semiconductor dies attached to the first side of the substrate and evenly distributed over the substrate width. Each die in the first and second groups has all terminals at one side which is attached to the first side of the substrate and an insulated or isolated face at a side opposite the side with the terminals. A first intermediary metal layer of the substrate forms a first DC terminal. A second intermediary metal layer of the substrate forms a second DC terminal. These intermediary metal layers are insulated from one another and form a parallel plate waveguide. Additional power semiconductor package embodiments are described.

18 Claims, 16 Drawing Sheets

(51) Int. Cl.
  *H01L 23/64* (2006.01)
  *H01L 23/66* (2006.01)
  *H01L 23/538* (2006.01)
  *H01L 23/00* (2006.01)
  *H01L 25/07* (2006.01)
  *H02M 7/00* (2006.01)
  *H05K 3/46* (2006.01)

(52) U.S. Cl.
  CPC ........ *H01L 23/5386* (2013.01); *H01L 23/645* (2013.01); *H01L 23/66* (2013.01); *H01L 24/49* (2013.01); *H01L 25/071* (2013.01); *H01L 25/072* (2013.01); *H01L 24/48* (2013.01); *H01L 2223/6627* (2013.01); *H01L 2224/05599* (2013.01); *H01L 2224/48227* (2013.01); *H01L 2924/00014* (2013.01); *H01L 2924/19105* (2013.01); *H02M 7/003* (2013.01); *H05K 3/4608* (2013.01); *H05K 3/4617* (2013.01); *H05K 2201/10166* (2013.01)

(58) Field of Classification Search
  USPC .................................. 363/98, 109; 257/103
  See application file for complete search history.

(56) References Cited

U.S. PATENT DOCUMENTS

| | | |
|---|---|---|
| 4,766,481 A | 8/1988 | Gobrecht et al. |
| 5,038,267 A | 8/1991 | De Doncker et al. |
| 5,150,287 A | 9/1992 | Gruning |
| 5,261,747 A | 11/1993 | Deacutis et al. |
| 5,404,273 A | 4/1995 | Akagawa |
| 5,574,312 A | 11/1996 | Bayerer et al. |
| 7,466,185 B2 | 12/2008 | Bayerer |
| 7,548,825 B2 | 6/2009 | Bayerer et al. |
| 7,561,446 B1 | 7/2009 | Vinciarelli |
| 7,766,337 B2 | 8/2010 | Bayerer |
| 7,791,208 B2 | 9/2010 | Bayerer |
| 7,808,100 B2 | 10/2010 | Bayerer |
| 8,018,047 B2 | 9/2011 | Bayerer et al. |
| 8,120,391 B2 | 2/2012 | Bayerer et al. |
| 8,146,513 B2 | 4/2012 | Ibaiondo Madariaga et al. |
| 8,154,114 B2 | 4/2012 | Bayerer |
| 8,212,413 B2 | 7/2012 | Jansen et al. |
| 8,228,113 B2 | 7/2012 | Domes |
| 8,441,128 B2 | 5/2013 | Domes |
| 8,487,407 B2 | 7/2013 | Bayerer et al. |
| 8,649,198 B2 | 2/2014 | Kuzumaki et al. |
| 2005/0007047 A1 | 1/2005 | Strothmann et al. |
| 2005/0174820 A1 | 8/2005 | Mutoh |
| 2006/0197491 A1 | 9/2006 | Nojima |
| 2007/0158359 A1 | 7/2007 | Hierholzer |
| 2007/0176626 A1 | 8/2007 | Bayerer et al. |
| 2007/0290311 A1 | 12/2007 | Hauenstein |
| 2008/0042164 A1 | 2/2008 | Kanschat |
| 2008/0106319 A1 | 5/2008 | Bayerer |
| 2008/0135932 A1 | 6/2008 | Ozeki et al. |
| 2009/0016088 A1 | 1/2009 | Bayerer et al. |
| 2009/0039498 A1 | 2/2009 | Bayerer |
| 2009/0085219 A1 | 4/2009 | Bayerer |
| 2009/0153223 A1 | 6/2009 | Bayerer |
| 2009/0261472 A1 | 10/2009 | Bayerer |
| 2010/0065962 A1 | 3/2010 | Bayerer et al. |
| 2010/0066175 A1 | 3/2010 | Jansen et al. |
| 2010/0085105 A1 | 4/2010 | Bayerer et al. |
| 2010/0164601 A1 | 7/2010 | Jansen |
| 2010/0254163 A1 | 10/2010 | Martini et al. |
| 2010/0328833 A1 | 12/2010 | Frisch et al. |
| 2011/0011633 A1 | 1/2011 | Uchida et al. |
| 2011/0019453 A1 | 1/2011 | Gonzalez Senosiain et al. |
| 2011/0075451 A1 | 3/2011 | Bayerer et al. |
| 2011/0102054 A1 | 5/2011 | Domes |
| 2011/0216561 A1 | 9/2011 | Bayerer et al. |
| 2012/0007530 A1 | 1/2012 | Imai et al. |
| 2012/0112775 A1 | 5/2012 | Domes |
| 2012/0206948 A1 | 8/2012 | Maldini et al. |
| 2012/0281442 A1 | 11/2012 | Revelant et al. |
| 2013/0043593 A1 | 2/2013 | Domes |
| 2013/0062750 A1 | 3/2013 | Lenniger et al. |
| 2013/0134572 A1 | 5/2013 | Lenniger et al. |
| 2013/0200859 A1 | 8/2013 | Jiang-Häfner et al. |
| 2016/0219705 A1 | 7/2016 | Bayerer |
| 2017/0079132 A1 | 3/2017 | Bayerer et al. |
| 2017/0105321 A1* | 4/2017 | Tokuyama ............ H01L 23/473 |
| 2017/0338734 A1* | 11/2017 | Nakashima ............ H02M 1/34 |

FOREIGN PATENT DOCUMENTS

| | | |
|---|---|---|
| DE | 102008049193 A1 | 1/2011 |
| DE | 102012218670 A1 | 4/2013 |
| DE | 102015101086 A1 | 4/2015 |
| EP | 0427143 A2 | 5/1991 |
| WO | 2014091608 A1 | 6/2014 |

OTHER PUBLICATIONS

Bayerer, Reinhold et al., "Power Circuit Design for Clean Switching", 2010 6th International Conference on Integrated Power Electronics Systems (GIPS), Mar. 16-18, 2010, pp. 1-6.

* cited by examiner

PARALLEL PLATE WAVEGUIDE FOR POWER SEMICONDUCTOR PACKAGE

TECHNICAL FIELD

The present application relates to power circuits, in particular power circuits with low parasitic inductance.

BACKGROUND

Power semiconductor packages include power semiconductor dies such as power transistor and/or power diode dies attached to a substrate such as a printed circuit board (PCB), laminate or ceramic substrate having a patterned metallized surface. The parasitic inductance in the commutation circuits of a power semiconductor package ideally should be extremely low to allow fast switching of the power semiconductors. There is a need for such power semiconductor package designs with very low parasitic inductance in the commutation circuits.

SUMMARY

According to a first embodiment of a power semiconductor package, the power semiconductor package comprises a substrate, groups of semiconductor dies and DC terminals. The substrate comprises a lowermost metal layer, an uppermost metal layer, a first intermediary metal layer separated from the lowermost metal layer by a first insulating layer, and a second intermediary metal layer above and separated from the first intermediary metal layer by a second insulating layer and below and separated from the uppermost metal layer by a third insulating layer, the uppermost metal layer being pattered into a plurality of strips which extend in parallel over a width of the substrate. A first group of semiconductor dies is attached to a first one of the strips of the uppermost metal layer and evenly distributed over the width of the first strip. A second group of semiconductor dies is attached to a second one of the strips of the uppermost metal layer and evenly distributed over the width of the second strip. A third group of semiconductor dies is attached to a third one of the strips of the uppermost metal layer and evenly distributed over the width of the third strip. A fourth group of semiconductor dies is attached to a fourth one of the strips of the uppermost metal layer and evenly distributed over the width of the fourth strip. A first DC terminal is attached to a fifth one of the strips of the uppermost metal layer and evenly distributed over the width of the fifth strip. A second DC terminal is attached to a sixth one of the strips of the uppermost metal layer and evenly distributed over the width of the sixth strip. The first group of semiconductor dies is electrically connected in series to the second group of semiconductor dies. The third group of semiconductor dies is electrically connected in series to the fourth group of semiconductor dies. The first DC terminal is electrically connected to the first intermediary metal layer through a plurality of conductive vias that extend through the third and the second insulating layers and insulated from the second intermediary metal layer. The second DC terminal is electrically connected to the second intermediary metal layer through a plurality of conductive vias that extend through the third insulating layer.

According to a second embodiment of a power semiconductor package, the substrate comprises a lowermost metal layer, an uppermost metal layer, and at least a first insulating layer separating the lowermost metal layer from the uppermost metal layer, the uppermost metal layer being patterned into a plurality of strips which extend in parallel over a width of the substrate. A first group of semiconductor dies is attached to a first one of the strips of the uppermost metal layer and evenly distributed over the width of the first strip, each semiconductor die in the first group having an insulated or isolated face attached to the first strip. A second group of semiconductor dies is attached to the first strip of the uppermost metal layer and evenly distributed over the width of the first strip, each semiconductor die in the second group having an insulated or isolated face attached to the first strip. A first DC terminal is attached to the first strip of the uppermost metal layer and evenly distributed over the width of the first strip. A second DC terminal is attached to a second one of the strips of the uppermost metal layer and evenly distributed over the width of the second strip. The first group of semiconductor dies is electrically connected in series to the second group of semiconductor dies.

According to a third embodiment of a power semiconductor package, the substrate comprises a lowermost metal layer, an uppermost metal layer, at least a first insulating layer separating the lowermost metal layer from the uppermost metal layer, and an intermediary metal layer insulated from the uppermost and the lowermost metal layers. A first group of semiconductor dies is attached to a first side of the intermediary metal layer and evenly distributed over a width of the intermediary metal layer, each semiconductor die in the first group having an insulated or isolated face attached to the first side of the intermediary metal layer. A second group of semiconductor dies is attached to a second side of the intermediary metal layer opposite the first side and evenly distributed over the width of the intermediary metal layer, each semiconductor die in the second group having an insulated or isolated face attached to the second side of the intermediary metal layer. The lowermost metal layer of the substrate forms a first DC terminal of the power semiconductor package, the uppermost metal layer of the substrate forms a second DC terminal of the power semiconductor package, and the intermediary metal layer of the substrate forms an AC terminal of the power semiconductor package. The first group of semiconductor dies is electrically connected in series to the second group of semiconductor dies.

According to a fourth embodiment of a power semiconductor package, the substrate comprises a plurality of metal layers separated from one another by an insulating layer. A first group of semiconductor dies is attached to a first side of the substrate and evenly distributed over a width of the substrate, each semiconductor die in the first group having all terminals at one side which is attached to the first side of the substrate and an insulated or isolated face at a side opposite the side with the terminals. A second group of semiconductor dies is attached to a second side of the substrate opposite the first side and evenly distributed over the width of the substrate, each semiconductor die in the second group having all terminals at one side which is attached to the second side of the substrate and an insulated or isolated face at a side opposite the side with the terminals. An uppermost one of the metal layers at the first side of the substrate is patterned to form a first DC terminal of the power semiconductor package, and a lowermost one of the metal layers at the second side of the substrate is patterned to form a second DC terminal of the power semiconductor package. The first group of semiconductor dies is electrically connected in series to the second group of semiconductor dies.

According to a fourth embodiment of a power semiconductor package, the substrate comprises a lowermost metal layer, an uppermost metal layer, and an intermediary metal layer separated from the lowermost metal layer by a first insulating layer and separated from the uppermost metal layer by a second insulating layer, the uppermost metal layer being patterned into a plurality of strips which extend in parallel over a width of the substrate. A first group of semiconductor dies is attached to a first one of the strips of the uppermost metal layer and evenly distributed over the width of the first strip, each semiconductor die in the first group having an insulated or isolated face attached to the first strip. A second group of semiconductor dies is attached to the first strip of the uppermost metal layer and evenly distributed over the width of the first strip, each semiconductor die in the second group having an insulated or isolated face attached to the first strip. A third group of semiconductor dies is attached to a second one of the strips of the uppermost metal layer and evenly distributed over the width of the second strip, each semiconductor die in the third group having an insulated or isolated face attached to the second strip. A fourth group of semiconductor dies is attached to the second strip of the uppermost metal layer and evenly distributed over the width of the second strip, each semiconductor die in the fourth group having an insulated or isolated face attached to the second strip. The first group of semiconductor dies is electrically connected in series to the second group of semiconductor dies, and the third group of semiconductor dies is electrically connected in series to the fourth group of semiconductor dies.

According to a fifth embodiment of a power semiconductor package, the substrate comprises a plurality of metal layers separated from one another by an insulating layer. A first group of semiconductor dies is attached to a first side of the substrate and evenly distributed over a width of the substrate, each semiconductor die in the first group having all terminals at one side which is attached to the first side of the substrate and an insulated or isolated face at a side opposite the side with the terminals. A second group of semiconductor dies is attached to the first side of the substrate and evenly distributed over the width of the substrate, each semiconductor die in the second group having all terminals at one side which is attached to the first side of the substrate and an insulated or isolated face at a side opposite the side with the terminals. A first intermediary one of the metal layers of the substrate forms a first DC terminal of the power semiconductor package and a second intermediary one of the metal layers of the substrate forms a second DC terminal of the power semiconductor package. The first and the second intermediary metal layers of the substrate are insulated from one another and form a parallel plate waveguide.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein integrate a parallel plate waveguide structure or an approximated parallel plate waveguide structure into the design of a power semiconductor package, e.g. for full integration of a 3-phase inverter or a 3-level circuit. The parallel plate/approximated parallel plate structures described herein are waveguides in that electric (E) and magnetic (B) fields enclosed by the plates are perpendicular to one another and shielded by the plates (skin effect). Current enters through one plate and exits through the other plate or approximated plate. While there may be some disturbance e.g. due to connections to DC− and/or DC+ terminals, the E and B fields still alternate over the length of the parallel plate/approximated parallel plate structures.

In some embodiments, the top (uppermost) plate, which may include more than one layer of the substrate, approximates a planar plate design and is formed by bond wire connections to the top metal layer of the substrate and to the power semiconductor dies, and the power semiconductor dies themselves. In other embodiments, both plates are formed by metal layers of the substrate. In each case, individual isolation layers or barrier layers can be provided at the bottom side (collector/drain/semiconductor substrate or cathode/anode) of the power semiconductor dies to yield a lateral structure with back side isolation, simplifying the design of the parallel plate/approximated parallel plate structure. Both the parallel plate waveguide structure and the approximated parallel plate waveguide structure significantly reduce the parasitic inductance in the commutation circuits of the power semiconductor package, allowing for faster switching of the power semiconductor dies included in the package.

Figure 1A:
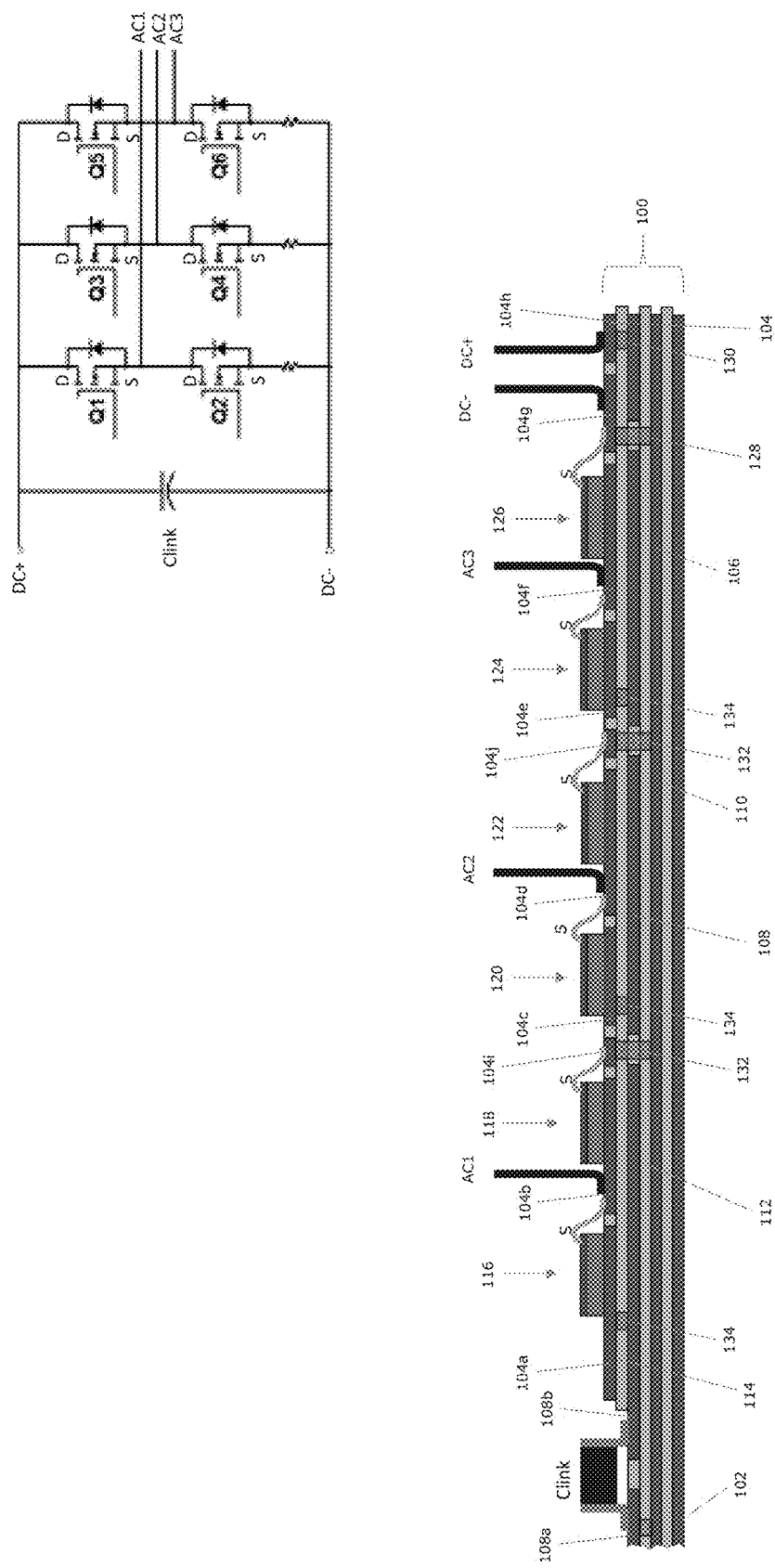
FIG. 1A illustrates a sectional view of a first embodiment of a power semiconductor package.
Figure 1B:
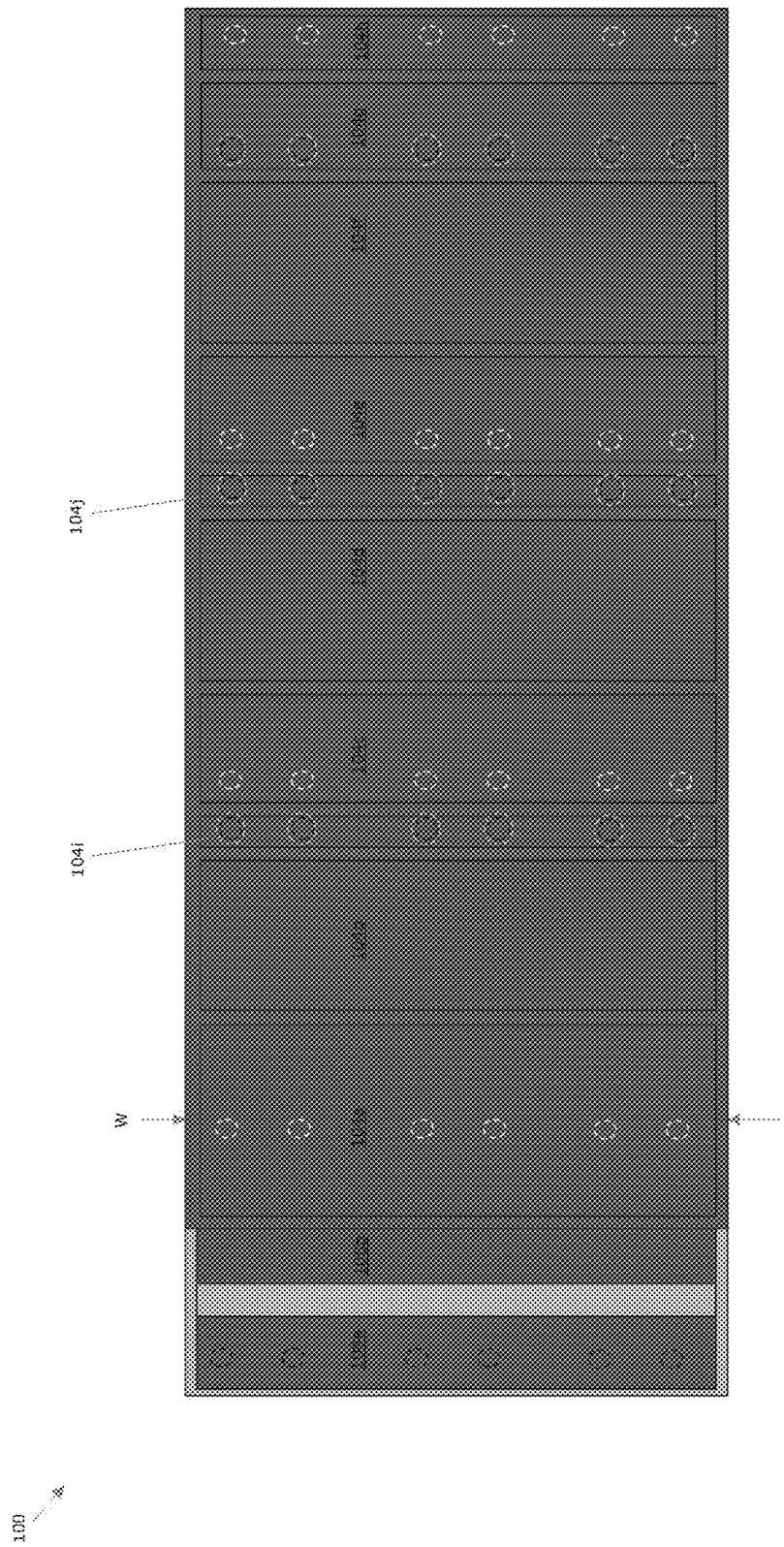
FIG. 1B illustrates a top down plan view of the substrate shown in FIG. 1A.

FIG. 1A illustrates a sectional view of a first embodiment of a power semiconductor package. The power semiconductor package comprises a substrate 100. FIG. 1B illustrates a top down plan view of the substrate 100.

The substrate 100 includes a lowermost metal layer 102, an uppermost metal layer 104, a lower intermediary metal layer 106 and an upper intermediary metal layer 108 above the lower intermediary metal layer 106. The lower intermediary metal layer 106 is separated from the lowermost metal layer 102 by a first insulating layer 110. The upper intermediary metal layer 108 is separated from the lower intermediary metal layer 106 by a second insulating layer 112, and separated from the uppermost metal layer 104 by a third insulating layer 114. The uppermost metal layer 104 is patterned into a plurality of strips 104a-104j which extend in parallel over a width (W) of the substrate 100.

The power semiconductor package further comprises a first group 116 of semiconductor dies, a second group 118 of semiconductor dies, a third group 120 of semiconductor dies, a fourth group 122 of semiconductor dies, a fifth group 124 of semiconductor dies, and a sixth group 126 of semiconductor dies. The first group 116 of semiconductor dies is electrically connected in series to the second group 118 of semiconductor dies to form a first half bridge, the third group 120 of semiconductor dies is electrically connected in series to the fourth group 122 of semiconductor dies to form a second half bridge, and the fifth group 124 of semiconductor dies is electrically connected in series to the sixth group 126 of semiconductor dies to form a third half bridge to yield a 3-phase inverter. A generic circuit schematic of an exemplary 3-phase inverter is shown in FIG. 1A, where device Q1 generically represents the first group 116 of semiconductor dies, device Q2 generically represents the second group 118 of semiconductor dies, etc. Each device Q1, Q2, . . . , Q6 shown in the circuit schematic is implemented by a plurality of semiconductor dies attached in a row to one strip of the uppermost metal layer 104 of the substrate 100. The semiconductor dies can include power MOSFETs (metal-oxide-semiconductor field effect transistors), IGBTs (insulated gate bipolar transistors, SiC or III-V power semiconductor transistors such as GaN transistors, etc. The transistor devices can be lateral or vertical devices.

To ensure current sharing of paralleled power semiconductors, each group of semiconductor dies is attached to one strip of the uppermost metal layer 104 and evenly distributed over the width of that strip. As such, the semiconductor dies in each group are placed side-by-side in a single row and the rows of dies are attached to parallel ones of the metal strips. The direction of each row of dies is oriented perpendicular to the current flowing within the parallel plates of the waveguide structure. The parallel plate waveguide structure comprises the upper and lower intermediary metal layers 106, 108 of the substrate 100. Current enters the upper intermediary metal layer 108 via a DC+ terminal of the package which is attached to one of the strips 104h of the uppermost metal layer 104, and current exits through the lower intermediary metal layer 106 via a DC− terminal attached to a different strip 104g of the uppermost metal layer 104. The DC+ and DC− terminals are evenly distributed over the width of the corresponding metal strips 104g, 104h to ensure the current is spread relatively evenly across the width of the substrate 100.

The DC− terminal is electrically connected to the lower intermediary metal layer 106 of the substrate 100 through a plurality of conductive vias 128 that extend through the third and second insulating layers 114, 112. The conductive vias 128 are insulated from the upper intermediary metal layer 108. The DC+ terminal is electrically connected to the upper intermediary metal layer 108 of the substrate 100 through a plurality of conductive vias 130 that extend through the third insulating layer 114. First additional conductive vias 132 extend through the substrate 100 to connect the source (emitter) terminals of the low-side power semiconductor dies represented by devices Q2, Q4 and Q6 in the schematic illustration to the DC− reference plane formed by the lower intermediary metal layer 106. Second additional conductive vias 134 extend through the substrate 100 to connect the drain (collector) terminals of the high-side power semiconductor dies represented by devices Q1, Q3 and Q5 in the schematic illustration to the DC+ reference plane formed by the upper intermediary metal layer 108. The conductive vias are illustrated as dashed circles in FIG. 1B since they are covered by the strips of the uppermost metal layer 104 in this view. The position of the intermediary metal layers 106, 108 of the substrate 100 electrically connected to the DC+ and DC− terminals can be switched as would the corresponding conductive vias, to yield an alternative design with the same parallel plate waveguide features. Unbundling the DC power terminals and the layers within the substrate 100 in the way illustrated in FIGS. 1A and 1B yields a more robust parallel waveguide design with fewer disturbances e.g. due to connections to DC− and DC+ terminals.

A first AC terminal AC1 is attached to the same strip 104b of the uppermost metal layer 104 as the second group 118 of semiconductor dies and evenly distributed over the width of that strip 104b. The source (emitter) of each semiconductor die included in the first group 116 of semiconductor dies is electrically connected to the metal strip 104b to which the first AC terminal AC1 is attached to form the first phase of the 3-phase inverter. A second AC terminal AC2 is attached to the same strip 104d of the uppermost metal layer 104 as the fourth group 122 of semiconductor dies and evenly distributed over the width of that strip 104d. The source (emitter) of each semiconductor die included in the third group 120 of semiconductor dies is electrically connected to the metal strip 104d to which the second AC terminal AC2 is attached to form the second phase of the 3-phase inverter. A third AC terminal AC3 is attached to the same strip 104f of the uppermost metal layer 104 as the sixth group 126 of semiconductor dies and evenly distributed over the width of that strip 104f. The source (emitter) of each semiconductor die included in the fifth group 124 of semiconductor dies is electrically connected to the metal strip 104f to which the third AC terminal AC3 is attached to form the third phase of the 3-phase inverter. Each DC and AC terminal can be implemented as a separate busbar or as a plurality of pins attached in a row and distributed evenly over the width of the corresponding metal strip of the uppermost metal layer 104. The drain (collector) connections of the semiconductor dies are through the bottom side of the respective dies to the corresponding metal strip of the uppermost metal layer 104. The gate connections are not shown for ease of illustration.

A DC-link capacitor (Clink) of the 3-phase inverter can also be integrated into the package design as shown in FIGS. 1A and 1B. In one embodiment, the DC link capacitor is implemented as a plurality of capacitor dies coupled in parallel between the DC+ and DC− planes. The capacitors are attached to and connect two strips 108a, 108b of the upper intermediary metal layer 108 of the substrate 102. These two strips 108a, 108b of the second intermediary metal layer 108 extend in parallel over a width of the second intermediary metal layer 108. The capacitors are evenly distributed over the width of the second intermediary metal layer 108 of the substrate 100 to even current distribution.

The substrate 100 to which the semiconductor dies of the 3-phase inverter are attached can be any standard substrate having a plurality of metal layers separated by insulating layers. For example, the substrate can be a laminate, a ceramic-based substrate such as a DCB (direct copper bonded) substrate, AMB (active metal brazed) substrate, or DAB (direct aluminum bonded) substrate with metallized surfaces, a printed circuit board (PCB), a substrate produced by a chip embedding technology such as eWLB (embedded wafer level ball grid array), etc.

The semiconductor package embodiment illustrated in FIGS. 1A and 1B utilizes semiconductor dies having an active backside i.e. vertical devices in which current flows between the front side facing away from the substrate 100 to the backside attached to the substrate 100. The semiconductor package embodiments described next utilize semiconductor dies having an insulated or isolated backside, simplifying the design of the parallel plate waveguide. Various die configurations are contemplated which have an insulated/isolated backside. FIGS. 2-9 illustrate various exemplary semiconductor die configurations in which the die backside is insulated or isolated from the uppermost metal layer of the package substrate.

Figure 2:
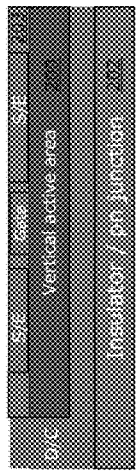

FIG. 2 shows a vertical power transistor die such as a power MOSFET or IGBT in which current flows vertically through the active area 200 of the die between the source/emitter (S/E) and the drain/collector (D/C) of the die. The amount of current flow is controlled by the voltage applied to the gate terminal (Gate) which is disposed at the front side of the die. The source/emitter terminal also is disposed at the front side. The drain/collector terminal is disposed at the backside of the active area. An insulator 202 such as a dielectric or molding compound covering the bottom side of the drain/collector terminal or a pn junction ensures proper electrical isolation between the drain/collector terminal of the die and the uppermost metal layer of the package substrate. The drain/collector terminal is brought up to the front side of the die so that all electrical connections are made at this side of the die. A termination/passivation layer 203 is provided at the front side of the die to ensure proper isolation of the die terminals.

Figure 3:
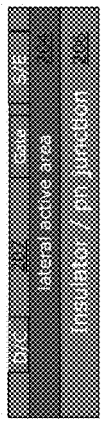
FIGS. 2-9 illustrate sectional views of exemplary semiconductor die configurations in which the die backside is insulated or isolated from the uppermost metal layer of a package substrate.

FIG. 3 shows a lateral power transistor die such as a GaN HEMT (high electron mobility transistor) in which current flows laterally through the active area 204 of the die between the source/emitter and drain/collector of the device. All terminals of the lateral die are formed at the front side of the die i.e. the side of the die facing away from the package substrate. An insulator 206 such as a dielectric or molding compound covering the bottom side of the die active area or a pn junction ensures proper electrical isolation between the die and the uppermost metal layer of the package substrate. A termination/passivation layer 207 is provided at the front side of the die to ensure proper isolation of the die terminals.

Figure 4:
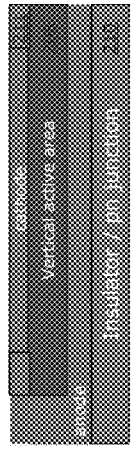

FIG. 4 shows a vertical power diode die in which current flows vertically through the active area 208 of the die between the (top) anode terminal and the (bottom) cathode terminal of the diode. Similar to the vertical transistor configuration shown in FIG. 2, an insulator 210 such as a dielectric or molding compound covering the bottom side of the cathode terminal or a pn junction ensures proper electrical isolation between the cathode terminal of the die and the uppermost metal layer of the package substrate. The cathode terminal is brought up to the front side of the die so that all electrical connections are made at this side of the die. A termination/passivation layer 211 is provided at the front side of the die to ensure proper isolation of the die terminals.

Figure 5:
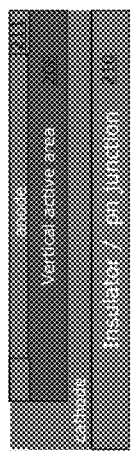

FIG. 5 shows a vertical power diode die similar to the one shown in FIG. 4, however, the position of the anode and cathode terminals are switched so that the cathode terminal is at the front side of the die and the anode terminal is at the backside. An insulator 210 such as a dielectric or molding compound covering the bottom side of the anode terminal or a pn junction ensures proper electrical isolation between the anode terminal of the die and the uppermost metal layer of the package substrate. The anode terminal is brought up to the front side of the die so that all electrical connections are made at this side of the die.

Figure 6:
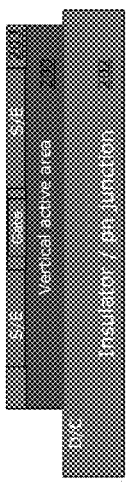

FIG. 6 shows a vertical transistor die similar to the one shown in FIG. 2, however, the drain/collector terminal is not brought up to the front side of the die. Instead, the drain/collector terminal is contacted at the side of the die and remains isolated from the underlying package substrate by the insulator/pn junction structure 202 formed on the backside of the die.

Figure 7:
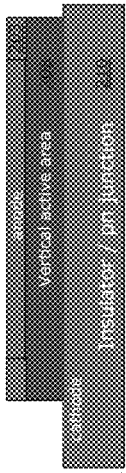

FIG. 7 shows a vertical diode die similar to the one shown in FIG. 4, however, the cathode terminal is not brought up to the front side of the die. Instead, the cathode terminal is contacted at the side of the die and remains isolated from the underlying package substrate by the insulator/pn junction structure 210 formed on the backside of the die.

Figure 8:
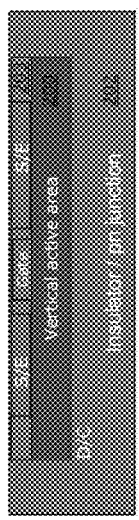

FIG. 8 shows a vertical transistor die similar to the one shown in FIG. 2, however, the drain/collector terminal is brought up to the front side of the die along at least two sides of the vertical active area.

Figure 9:
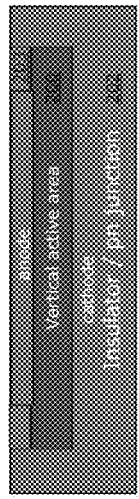

FIG. 9 shows a vertical diode die similar to the one shown in FIG. 4, however, the cathode terminal is brought up to the front side of the die along at least two sides of the vertical active area.

Figure 10:
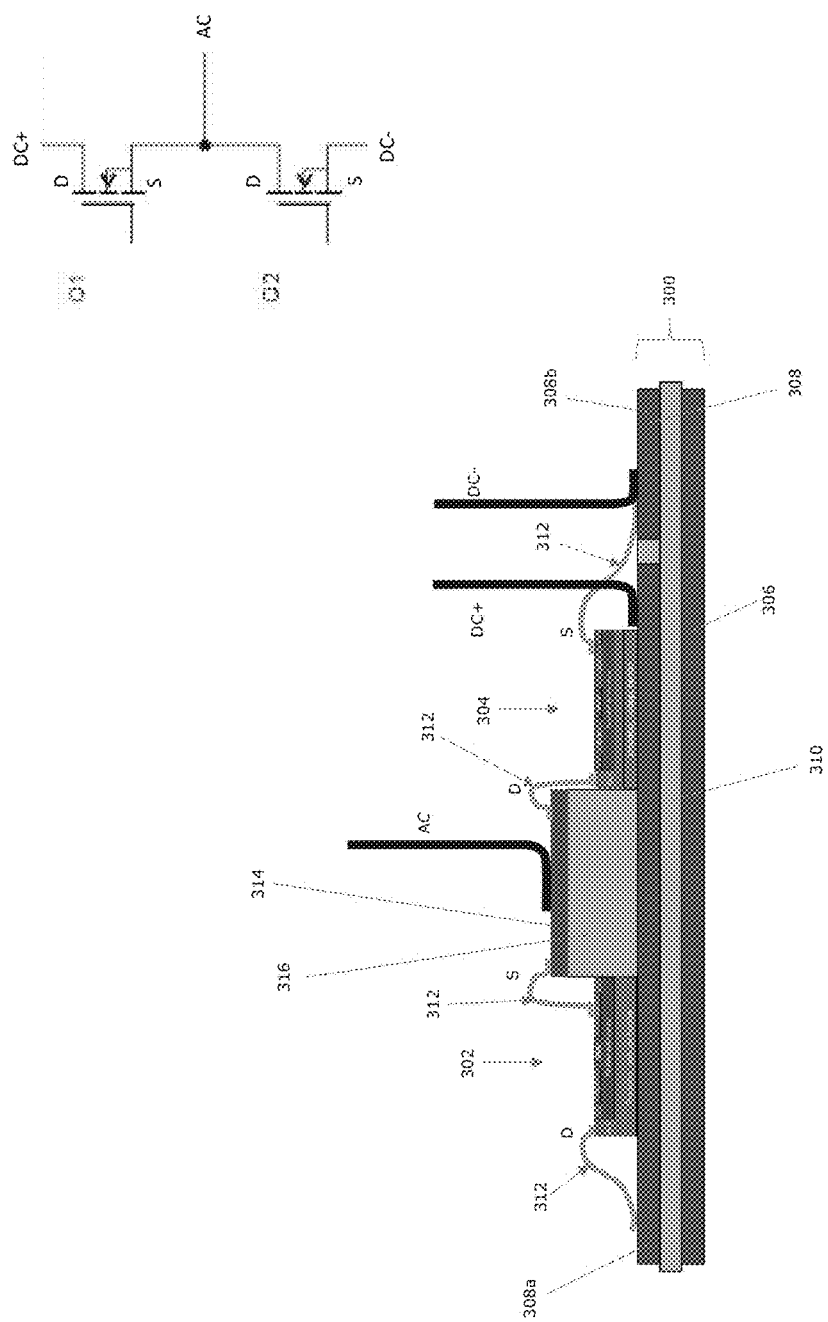
FIG. 10 illustrates a sectional view of a second embodiment of a power semiconductor package.

FIG. 10 illustrates a sectional view of another embodiment of a power semiconductor package. The power semiconductor package comprises a substrate 300 and two groups 302, 304 of power semiconductor dies each having a backside attached to the substrate 300, the backside of each die being insulated or isolated from the substrate 300 e.g. as previously described herein with respect to FIGS. 2-9.

The substrate 300 includes a lowermost metal layer 306, an uppermost metal layer 308, and at least a first insulating layer 310 separating the lowermost metal layer 306 from the uppermost metal layer 308. The uppermost metal layer 308 is patterned into a plurality of strips 308a, 308b which extend in parallel over a width of the substrate 300. A first group 302 of the semiconductor dies is attached to a first one of the strips 308a of the uppermost metal layer 308 and evenly distributed over the width of the first strip 308a. A second group 304 of the semiconductor dies is attached to the same strip 308a of the uppermost metal layer 308 as the first group 302 of dies, and is evenly distributed over the width of the strip 308a. Each semiconductor die in the first and second groups 302, 304 has an insulated or isolated face attached to the first strip 308a e.g. as previously described herein with respect to FIGS. 2-9. The first group 302 of semiconductor dies is electrically connected in series to the second group 304 of semiconductor dies to form a half bridge circuit.

A generic circuit schematic of an exemplary half bridge inverter is shown in FIG. 10, where device Q1 generically represents the first group 302 of semiconductor dies and device Q2 generically represents the second group 304 of semiconductor dies. Each device Q1, Q2 shown in the circuit schematic is implemented by a plurality of semiconductor dies attached in a row to one strip 308a of the uppermost metal layer 308 of the substrate 300. The semiconductor dies can include power MOSFETs (metal-oxide-semiconductor field effect transistors), IGBTs (insulated gate bipolar transistors, III-V power semiconductor transistors such as GaN transistors, etc. The transistor devices can be lateral or vertical devices.

One or more additional series-connected (half bridge) groups of semiconductor dies can be attached to further strips (not shown) of the uppermost metal layer 308 of the substrate 300 to form a multi-phase inverter e.g. as schematically illustrated in FIGS. 1A and 1B. Alternatively, the circuit can be a multi-level inverter as described later herein. In each case, a DC+ terminal is attached to the same strip 308a of the uppermost metal layer 308 as the semiconductor dies in the first and second groups 302, 304 and evenly distributed over the width of the metal strip 308a. A DC− terminal is attached to a different strip 308b of the uppermost metal layer 308 than the DC+ terminal and evenly distributed over the width of that metal strip 308b. Evenly distributing the semiconductor dies and the DC terminals across the width of the substrate 300 ensures a relatively even spread of current flowing through the parallel plate waveguide structure.

According to the embodiment shown in FIG. 10, the bottom plate of the waveguide structure is formed by the uppermost metal layer 308 of the substrate 300. The top plate of the waveguide approximates a planar plate design and is formed by bond wire connections 312 to the top metal layer 308 of the substrate 300 and to the power semiconductor dies in the first and second groups 302, 304, and the power semiconductor dies themselves. Current enters the uppermost metal layer 308 of the substrate 300 via the DC+ terminal of the package which is attached to the same strip 308b of the uppermost metal layer 308 as the in the first and second groups 302, 304 of semiconductor dies. Current exits through the approximated upper plate via the DC− terminal. Unlike the embodiment illustrated in FIGS. 1A and 1B, conductive via connections to intermediary metal layers of the substrate 300 are not needed due to the use of semiconductor dies having an insulated or isolated backside, thus simplifying the substrate design and reducing the number of disturbances in the lower plate of the waveguide structure.

The drain (collector) terminal of the semiconductor dies in the first group 302 are electrically connected to the same strip 308b of the uppermost metal layer 308 as the DC+ terminal, through a plurality of corresponding bond wire connections 312. The source (emitter) terminal of the semiconductor dies in the first group 302 are electrically connected to an additional metal strip 314 separated from the uppermost metal layer 308 of the substrate 300 by an insulating layer 316, through a plurality of corresponding bond wire connections 312. The drain (collector) terminal of the semiconductor dies in the second group 304 are electrically connected to the additional metal strip 314 insulated from the uppermost metal layer 308 of the substrate 300, through corresponding bond wire connections 312. The source (emitter) terminal of the semiconductor dies in the second group 304 are electrically connected to the same strip 308b of the uppermost metal layer 308 as the DC− terminal, through corresponding bond wire connections 312. The AC terminal of the power semiconductor package is attached to the additional metal strip 314 insulated from the uppermost metal layer 308 of the substrate 300.

FIGS. 11 through 14 illustrate additional embodiments of power semiconductor packages having a parallel plate waveguide structure and with a pluggable or press-fit type interface.

Figure 11:
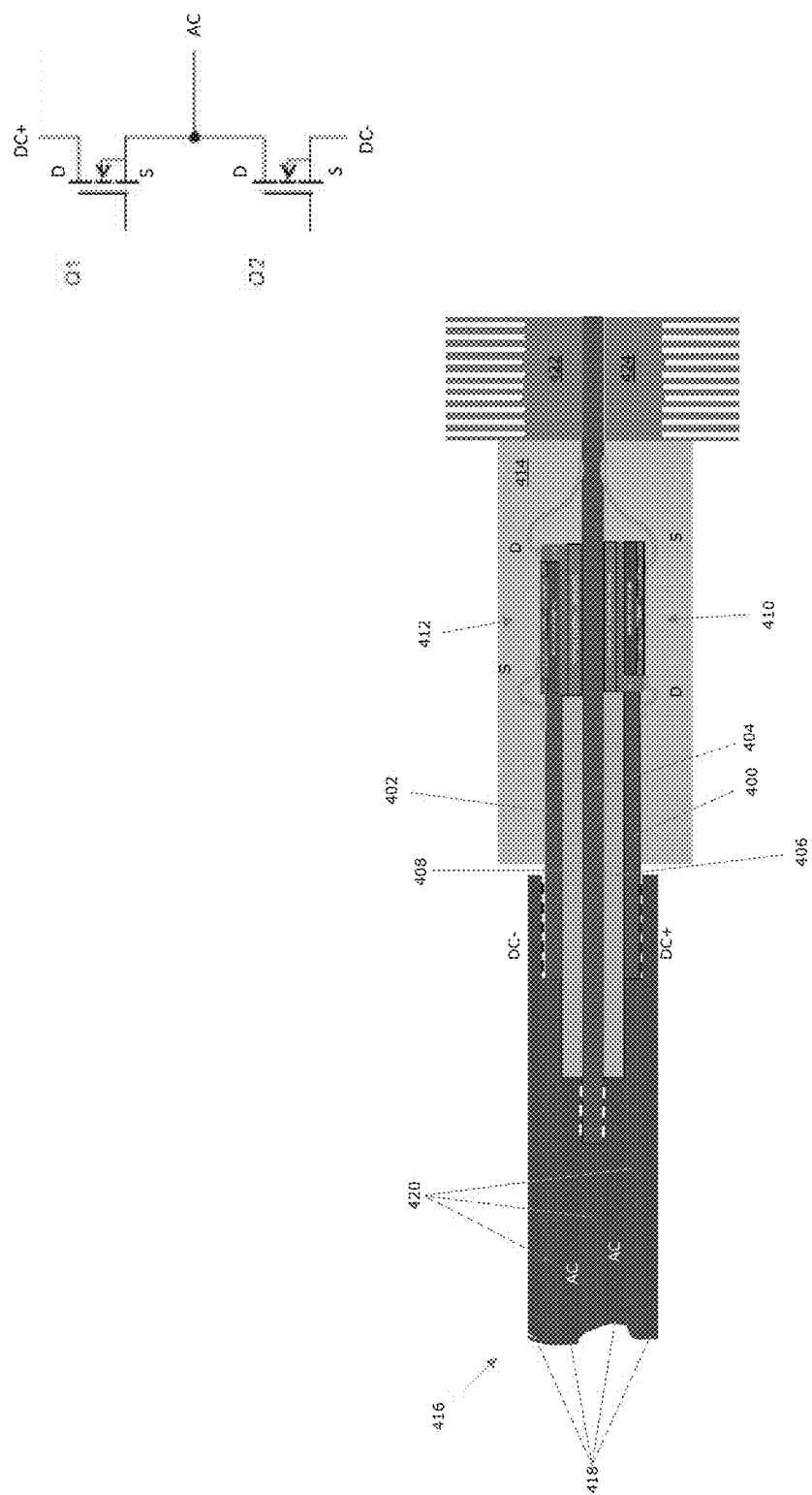
FIG. 11 illustrates a sectional view of a third embodiment of a power semiconductor package.

FIG. 11 illustrates an embodiment of a power semiconductor package that comprises a substrate having a lowermost metal layer 400, an uppermost metal layer 402 and an intermediary metal layer 404 insulated from the uppermost and lowermost metal layers 400, 402 by respective insulating layers 406, 408. A first group 410 of semiconductor dies is attached to the bottom side of the intermediary metal layer 404 and evenly distributed over a width of the intermediary metal layer 404. Each semiconductor die in the first group 410 has an insulated or isolated face attached to the bottom side of the intermediary metal layer 404 e.g. as previously described herein with respect to FIGS. 2-9. A second group 412 of semiconductor dies is attached to the top side of the intermediary metal layer 404 and evenly distributed over the width of the intermediary metal layer 404. Each semiconductor die in the second group 412 has an insulated or isolated face attached to the second side of the intermediary metal layer 404 e.g. as previously described herein with respect to FIGS. 2-9. The first group 410 of semiconductor dies is electrically connected in series to the second group 412 of semiconductor dies to form a half bridge circuit.

A generic circuit schematic of an exemplary half bridge circuit is shown in FIG. 11, where device Q1 generically represents the first group 410 of semiconductor dies and device Q2 generically represents the second group 412 of semiconductor dies. Each device Q1, Q2 shown in the circuit schematic is implemented by a plurality of semiconductor dies attached in a row to the intermediary metal layer 404 of the substrate. The semiconductor dies can include power MOSFETs (metal-oxide-semiconductor field effect transistors), IGBTs (insulated gate bipolar transistors, III-V power semiconductor transistors such as GaN transistors, etc. The transistor devices can be lateral or vertical devices.

One or more additional series-connected (half bridge) groups of semiconductor dies can be attached to further strips (not shown) of the intermediary metal layer 404 of the substrate to form a multi-phase inverter. Alternatively, the circuit can be a multi-level inverter as described later herein. In each case, the lowermost metal layer 400 of the substrate forms the DC+ terminal of the power semiconductor package and the uppermost metal layer 402 of the substrate forms the DC− terminal of the power semiconductor package. The position of the DC+ and DC− terminals can be reversed, to yield an alternative design with the same parallel plate waveguide features. In either case, the intermediary metal layer 404 of the substrate forms the AC terminal of the power semiconductor package. The AC and DC terminals are each evenly distributed over the width of the substrate, to ensure a relatively even spread of current flowing through the parallel plate waveguide structure.

The intermediary metal layer 404 of the substrate, which forms the AC terminal of the half bridge circuit, is partly shielded by the DC+ and DC− terminals and forms part of a 3-layer parallel plate design according to this embodiment. The middle plate of the waveguide is formed by the intermediary metal layer 404 of the substrate, the lower plate of the waveguide is formed by the lowermost metal layer 400 of the substrate and the upper plate of the waveguide is formed by the uppermost metal layer 402 of the substrate. If the metal layers 400, 402, 404 of the substrate are spaced close enough and the insulating layers 406, 408 of the substrate are not too thick, low parasitic inductance is realized between the metal layers 400, 402, 404.

An insulating material 414 such as a plastic molding compound can encapsulate the first and second groups 410, 412 of semiconductor dies, part of the uppermost metal layer 402, part of the lowermost metal layer 400, and part of the intermediary metal layer 404 so that the uppermost metal layer 402, the lowermost metal layer 400 and the intermediary metal layer 404 protrude from the insulating material 414. The end of the substrate that protrudes from the insulating material 414 can form a pluggable or press-fit type interface with a correspondingly-shaped connector 416 having metal layers 418 separated by insulating layers 420.

Cooling can be provided through the intermediary (AC) metal layer 404 of the substrate by integrated channels for liquid or attached heat sinks. For example, as illustrated in FIG. 11, the intermediary metal layer 404 of the substrate protrudes from opposing sides of the insulating material 414. At the exposed end of the intermediary metal layer 404 opposite the pluggable/press-fit type interface, a first heatsink 422 can be attached to the top side of the intermediary metal layer 404 and a second heatsink 424 can be attached to the bottom side of the intermediary metal layer 404.

Figure 12:
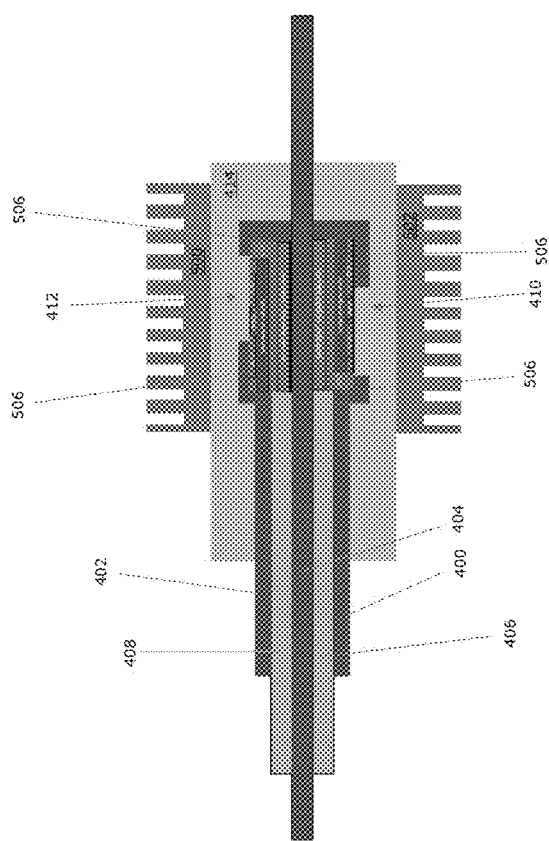
FIG. 12 illustrates a sectional view of a fourth embodiment of a power semiconductor package.

FIG. 12 illustrates another embodiment of a power semiconductor package having a parallel plate waveguide formed by three metal layers 400, 402, 404 of a substrate. The embodiment shown in FIG. 12 is similar to the embodiment shown in FIG. 11. Different, however, cooling is provided through the insulating material 414 that encapsulates the semiconductor dies and part of the substrate. A first heatsink 500 can be attached to a first (bottom) side of the insulating material 414 covering the first group 410 of semiconductor dies. A second heatsink 502 can be attached to a second (top) side of the insulating material 414 covering the second group 412 of semiconductor dies.

Further according to the embodiment illustrated in FIG. 12, metallization 504 is formed on the insulated/isolated semiconductor dies to provide electrical connections to the DC+, DC− and AC terminals realized by the metal layers 400, 402, 404 of the substrate. The metallization 504 can be deposited e.g. by sputtering, electroplating (galvanic deposition), etc. In one embodiment, a chip embedding technology such as eWLB (embedded wafer level ball grid array) can be used to form the metal and insulating layers 404-408 of the substrate and the metallization 504 that provides electrical connections to the DC+, DC− and AC terminals realized by the metal layers 400, 402, 404 of the substrate.

Figure 13:
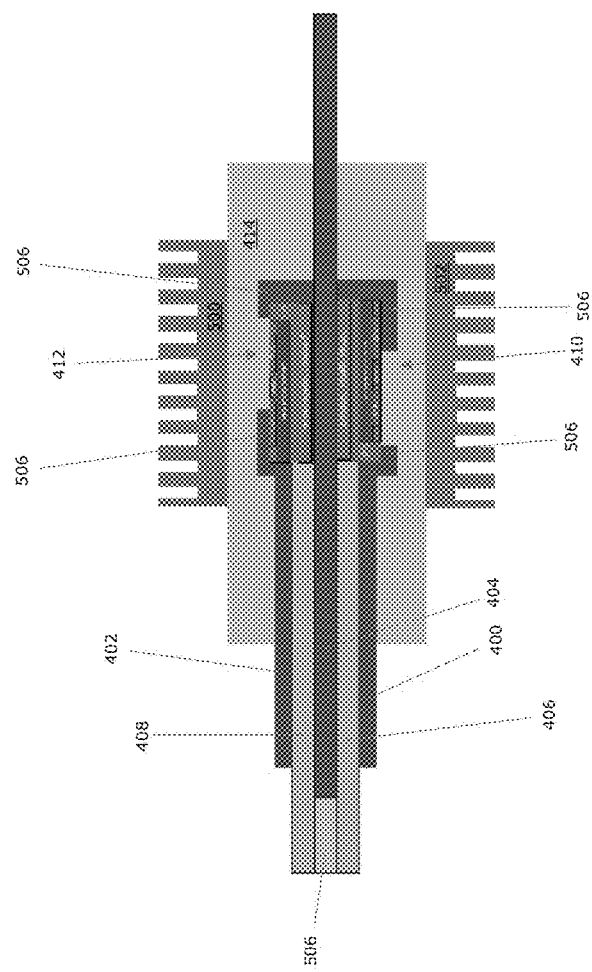
FIG. 13 illustrates a sectional view of a fifth embodiment of a power semiconductor package.

FIG. 13 illustrates yet another embodiment of a power semiconductor package having a parallel plate waveguide formed by three metal layers 400, 402, 404 of a substrate. The embodiment shown in FIG. 13 is similar to the embodiment shown in FIG. 11. Different, however, the end of the intermediary metal layer 404 closest to the pluggable/press-fit type interface is covered by an insulating material 506 and therefore not exposed. Electrical contact to the intermediary metal layer 404 of the substrate is made at the opposite end.

Figure 14:
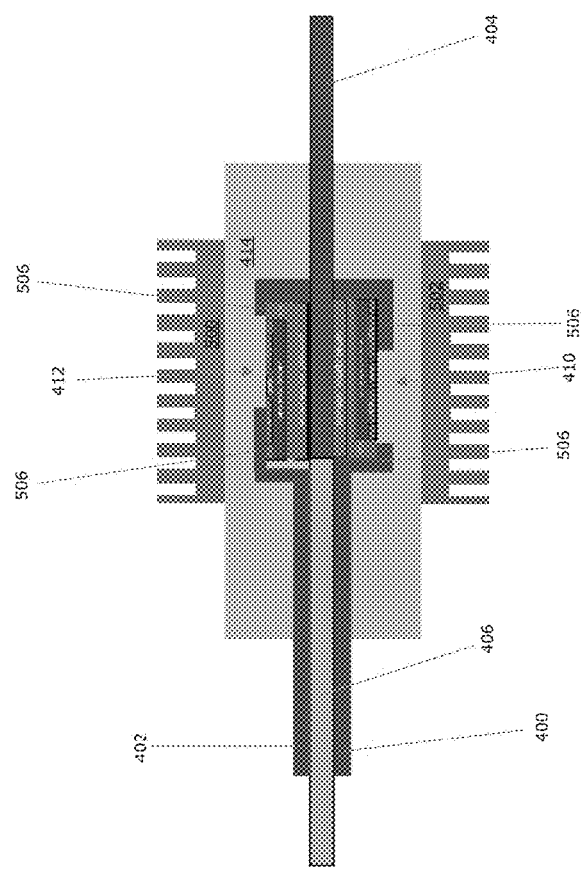
FIG. 14 illustrates a sectional view of a sixth embodiment of a power semiconductor package.

FIG. 14 illustrates still another embodiment of a power semiconductor package having a parallel plate waveguide formed by three metal layers 400, 402, 404 of a substrate. The embodiment shown in FIG. 14 is similar to the embodiment shown in FIG. 13. Different, however, the intermediary metal layer 404 terminates at the end closest to the pluggable/press-fit type interface prior to extending between the uppermost and lowermost metal layers 400, 402 of the substrate. This way, the uppermost and lowermost metal layers 400, 402 are separated from one another by only a single insulating layer 406.

Figure 15:
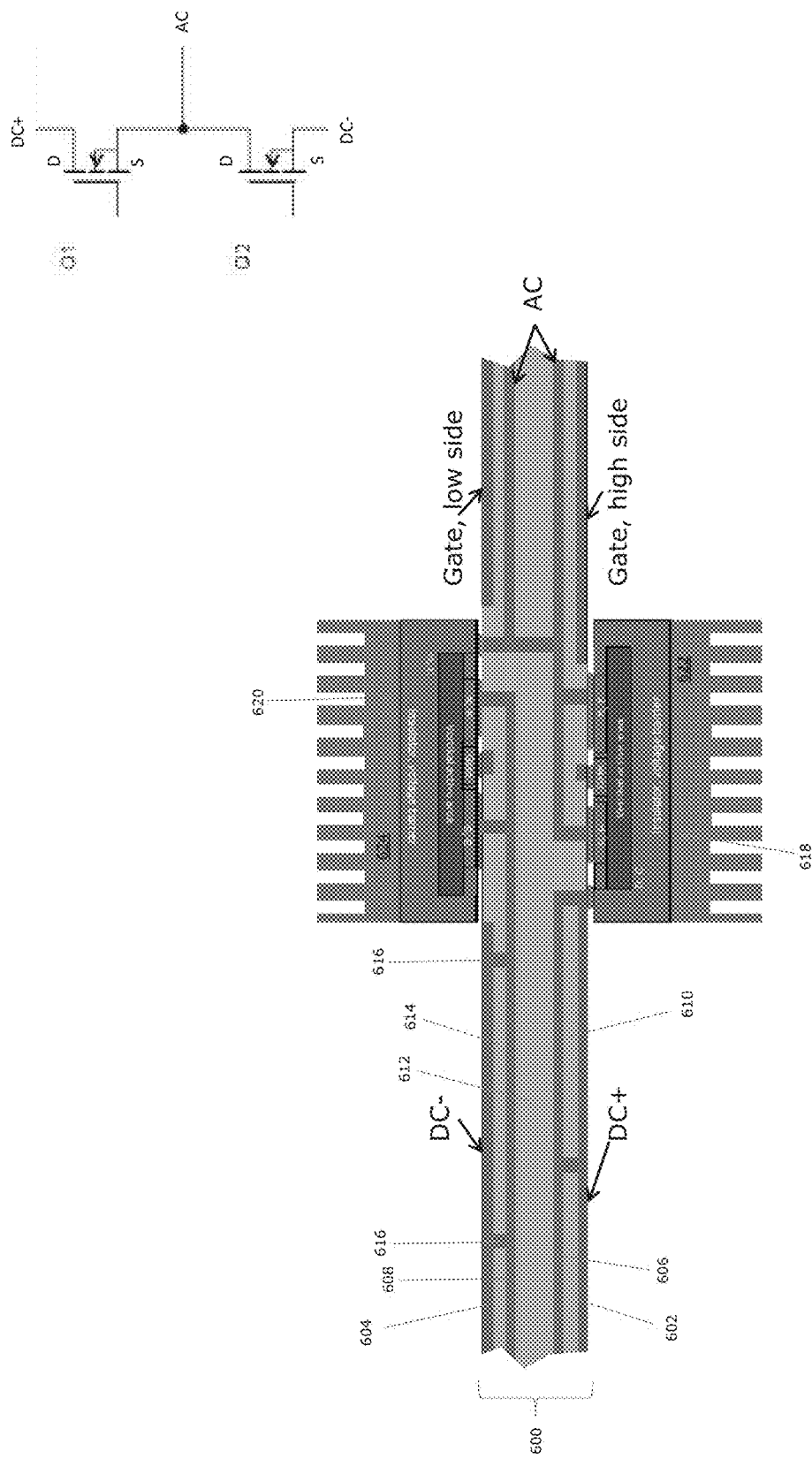
FIG. 15 illustrates a sectional view of a seventh embodiment of a power semiconductor package.

FIG. 15 illustrates an embodiment of a power semiconductor package that comprises a substrate 600 such as a PCB, laminate or substrate formed by a chip embedding technology such as eWLB. The substrate 600 has a plurality of metal layers 602, 604, 606, 608 separated from one another by respective insulating layers 610, 612, 614. The parallel plate waveguide is formed by the metal layers 602, 604, 606, 608 of the substrate 600. Conductive vias 616 within the substrate interconnect the parallel plates.

A first group 618 of semiconductor dies is attached to a first side of the substrate 600 and evenly distributed over a width of the substrate 600. Each semiconductor die in the first group 618 has all terminals at one side which is attached to the first side of the substrate 600 and an insulated or isolated face at the opposite side e.g. as previously described herein with respect to FIGS. 2-9. A second group 620 of semiconductor dies is attached to a second side of the substrate 600 opposite the first side and evenly distributed over the width of the substrate 600. Each semiconductor die in the second group 620 has all terminals at one side which is attached to the second side of the substrate 600 and an insulated or isolated face at the opposite side e.g. as previously described herein with respect to FIGS. 2-9. The first group 618 of semiconductor dies is electrically connected in series to the second group 620 of semiconductor dies to form a half bridge circuit.

A generic circuit schematic of an exemplary half bridge circuit is shown in FIG. 15, where device Q1 generically represents the first group 618 of semiconductor dies and device Q2 generically represents the second group 620 of semiconductor dies. Each device Q1, Q2 shown in the circuit schematic is implemented by a plurality of semiconductor dies attached in a row to one strip of either the uppermost or lowermost metal layer 602/604 of the substrate 600. The semiconductor dies can include power MOSFETs (metal-oxide-semiconductor field effect transistors), IGBTs (insulated gate bipolar transistors, III-V power semiconductor transistors such as GaN transistors, etc. The transistor devices can be lateral or vertical devices.

One or more additional series-connected (half bridge) groups of semiconductor dies can be attached to further strips (not shown) of the uppermost and lowermost metal layers 602, 604 of the substrate 604 to form a multi-phase inverter. Alternatively, the circuit can be a multi-level inverter as described later herein. In each case, the lowermost metal layer 602 of the substrate 600 is patterned to form both the DC+ plane of the power semiconductor package and a pathway for carrying gate signals to the semiconductor dies in the first group 618 of dies. The uppermost metal layer 604 of the substrate 600 is patterned to form both the DC− plane of the power semiconductor package and a pathway for carrying gate signals to the semiconductor dies in the second group 620 of dies. The position of the DC+ and DC− planes within the substrate 600 can be reversed, to yield an alternative design with the same parallel plate waveguide features. In either case, the AC and DC planes are each evenly distributed over the width of the substrate 600 to ensure a relatively even spread of current flowing through the parallel plate waveguide structure.

Further according to the embodiment illustrated in FIG. 15, a first heatsink 622 can be attached to the insulated or isolated face of each semiconductor die included in the first group 618 of dies. Similarly, a second heatsink 624 can be attached to the insulated or isolated face of each semiconductor die included in the second group 620 of dies.

Figure 16:
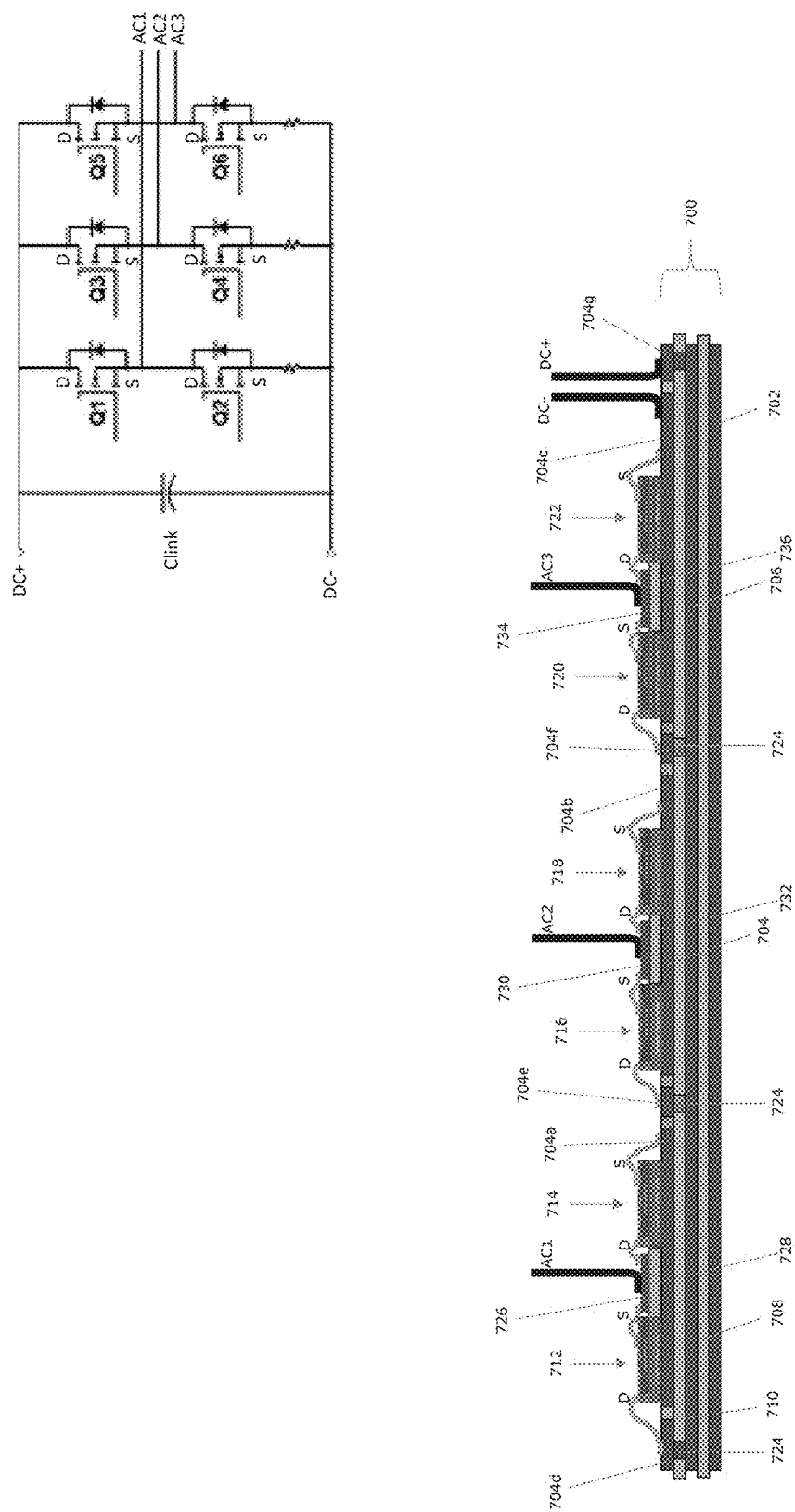
FIG. 16 illustrates a sectional view of an eighth embodiment of a power semiconductor package.

FIG. 16 illustrates an embodiment of a power semiconductor package that comprises a substrate 700 having a lowermost metal layer 702, an uppermost metal layer 704, and an intermediary metal layer 706 separated from the lowermost metal layer 702 by a first insulating layer 708 and separated from the uppermost metal layer 704 by a second insulating layer 710. The uppermost metal layer 704 is patterned into a plurality of strips 704a-704g which extend in parallel over the width of the substrate 700.

A first group 712 of semiconductor dies is attached to a first one of the strips 704a of the uppermost metal layer 704 and evenly distributed over the width of the first strip 704a. Each semiconductor die in the first group 712 has an insulated or isolated face attached to the first strip 704a e.g. as previously described herein with respect to FIGS. 2-9. A second group 714 of semiconductor dies is attached to the same first metal strip 704a as the first group 712 of dies and also evenly distributed over the width of the first strip 704a.

Each semiconductor die in the second group 714 has an insulated or isolated face attached to the first strip 704a e.g. as previously described herein with respect to FIGS. 2-9.

A third group 716 of semiconductor dies is attached to a second one of the strips 704b of the uppermost metal layer 704 and evenly distributed over the width of the second strip 704b. Each semiconductor die in the third group 716 has an insulated or isolated face attached to the second strip 704b e.g. as previously described herein with respect to FIGS. 2-9. A fourth group 718 of semiconductor dies is attached to the same second metal strip 704b as the third group 716 of dies and also evenly distributed over the width of the second strip 704b. Each semiconductor die in the fourth group 718 has an insulated or isolated face attached to the second strip 704b e.g. as previously described herein with respect to FIGS. 2-9.

A fifth group 720 of semiconductor dies is attached to a third one of the strips 704c of the uppermost metal layer 704 and evenly distributed over the width of the third strip 704c. Each semiconductor die in the fifth group 720 has an insulated or isolated face attached to the third strip 704c e.g. as previously described herein with respect to FIGS. 2-9. A sixth group 722 of semiconductor dies is attached to the same third metal strip 704c as the fifth group 720 of dies and also evenly distributed over the width of the third strip 704c. Each semiconductor die in the sixth group 722 has an insulated or isolated face attached to the third strip 704c e.g. as previously described herein with respect to FIGS. 2-9.

The first group 712 of semiconductor dies is electrically connected in series to the second group 714 of semiconductor dies, the third group 716 of semiconductor dies is electrically connected in series to the fourth group 718 of semiconductor dies, and the fifth group 720 of semiconductor dies is electrically connected in series to the sixth group 722 of semiconductor dies to form a 3-phase inverter. A generic circuit schematic of an exemplary 3-phase inverter is shown in FIG. 16, where device Q1 generically represents the first group 712 of semiconductor dies, device Q2 generically represents the second group 714 of semiconductor dies, etc. Each device Q1, Q2, . . . , Q6 shown in the circuit schematic is implemented by a plurality of semiconductor dies attached in a row to one strip of the uppermost metal layer 704 of the substrate 700. The semiconductor dies can include power MOSFETs (metal-oxide-semiconductor field effect transistors), IGBTs (insulated gate bipolar transistors, III-V power semiconductor transistors such as GaN transistors, etc. The transistor devices can be lateral or vertical devices.

To ensure current sharing of paralleled power semiconductors, each group of semiconductor dies is evenly distributed in a row over the width of the metal strip to which those dies are attached. The direction of each row of dies is oriented perpendicular to the current flowing within the parallel plates of the waveguide structure. The parallel plate waveguide structure comprises the uppermost metal layer 704 and the intermediary metal layer 706 of the substrate 700. Current enters the intermediary metal layer 706 via the DC+ terminal of the package which is attached to one of the strips 704g of the uppermost metal layer 704, and current exits through the uppermost metal layer 704 via the DC− terminal. The DC+ and DC− terminals are evenly distributed over the width of the corresponding metal strips 704c, 704g to ensure the current is spread relatively evenly across the width of the substrate 700. Electrical connections from the drains of the high side transistors represented by devices Q1, Q3 and Q5 in the circuit schematic to the intermediary metal layer 706 of the substrate 700 which forms the DC+ plane are provided by conductive vias 724 which extend through and are insulated from the uppermost metal layer 704 of the substrate 700 and through the upper insulating layer 710 of the substrate 700. The position of the DC+ and DC− planes within the substrate 700 can be reversed, to yield an alternative design with the same parallel plate waveguide features. In either case, the DC terminals are each evenly distributed over the width of the substrate 700 to ensure a relatively even spread of current flowing through the parallel plate waveguide structure.

The AC terminals of the 3-phase inverter are provided above the substrate 700. More particularly, a first AC terminal AC1 is attached to a first additional metal strip 726 disposed over the first strip 704a of the uppermost metal layer 704 of the substrate. The first additional metal strip 726 is disposed between the first and second groups 712, 714 of semiconductor dies, extends over the width of the first strip 704a, and is separated from the uppermost metal layer 704 by an insulating layer 728. The first AC terminal AC1 is evenly distributed over the width of the first additional metal strip 726. A second AC terminal AC2 is attached to a second additional metal strip 730 disposed over the second strip 704b of the uppermost metal layer 704 of the substrate 700. The second additional metal strip is disposed between the third and fourth groups 716, 718 of semiconductor dies, extends over the width of the second strip 704b, and is separated from the uppermost metal layer 704 by an insulating layer 732. The second AC terminal AC2 is evenly distributed over the width of the second additional metal strip 730. A third AC terminal AC3 is attached to a third additional metal strip 734 disposed over the third strip 704c of the uppermost metal layer 704 of the substrate 700. The third additional metal strip 734 is disposed between the fifth and sixth groups 720, 722 of semiconductor dies, extends over the width of the third strip 704c, and is separated from the uppermost metal layer 704 by an insulating layer 736. The third AC terminal AC3 is evenly distributed over the width of the third additional metal strip 734. Each AC terminal can be implemented as a separate busbar or as a plurality of pins attached in a row and distributed evenly over the width of the corresponding additional metal strip disposed above the substrate 700.

The embodiment illustrated in FIG. 16 expands the parallel plate waveguide design illustrated in FIG. 10 (half bridge inverter) to accommodate a 3-level topology. Compared to the embodiment illustrated in FIGS. 1A and 1B, the embodiment illustrated in 16 requires one less insulation layer in the substrate 700 to realize the parallel plate waveguide. The additional insulation layer is omitted due to the use of semiconductor dies having an insulated or isolated face attached to the uppermost metal layer 704 of the substrate 700.

Figure 17:
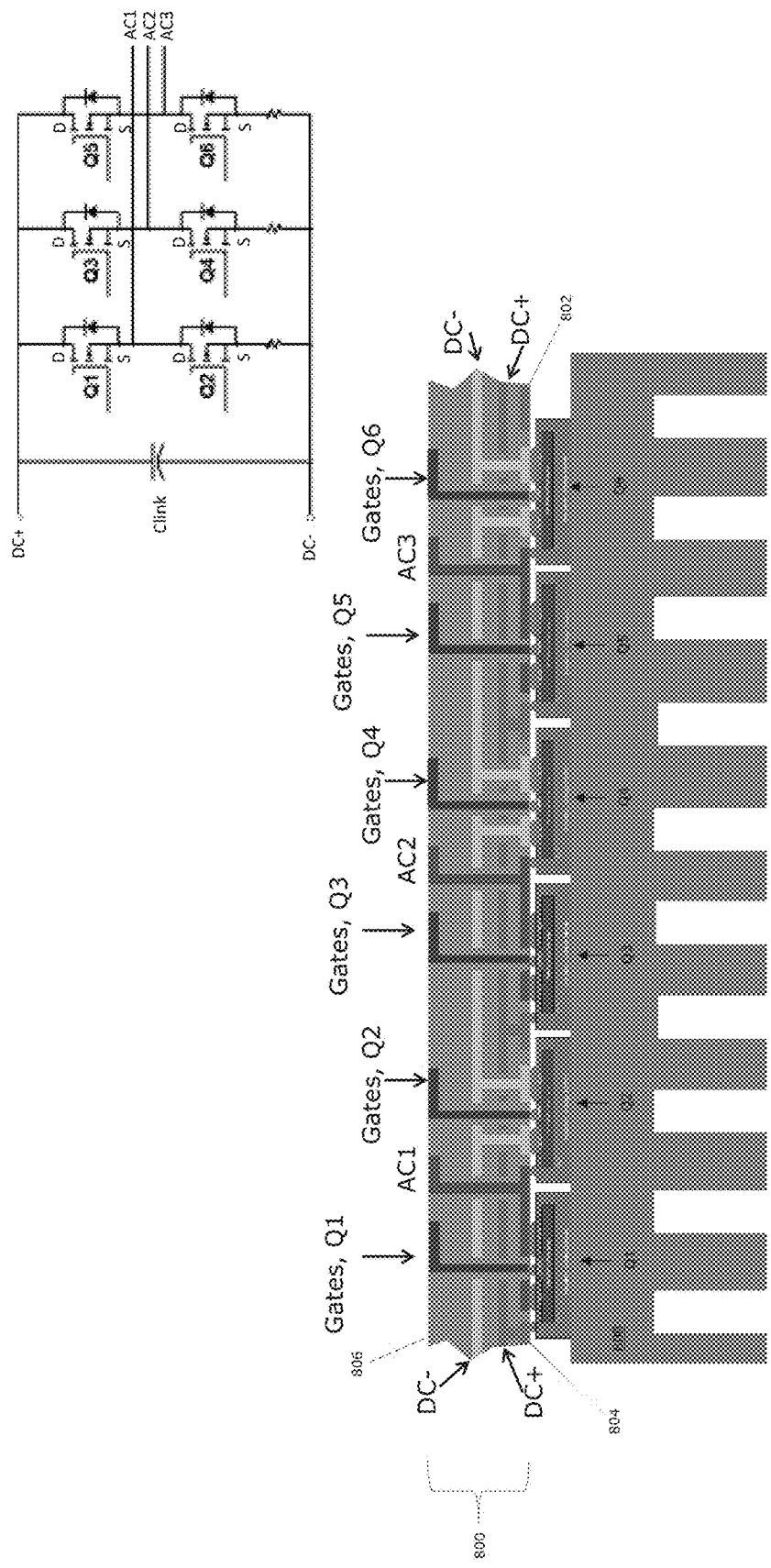
FIG. 17 illustrates a sectional view of a ninth embodiment of a power semiconductor package.

FIG. 17 illustrates an embodiment of a power semiconductor package which is similar to the embodiment shown in FIG. 15. Different, however, the circuit is expanded from a single half bridge inverter to a 3-phase inverter as indicated by the equivalent circuit schematic shown in FIG. 17. Each pair of series-connected groups of semiconductor dies is represented by one leg Q1/Q2, Q3/Q4, Q5/Q6 of the 3-phase circuit schematic in FIG. 17. Each device Q1, Q2, etc. is implemented by a plurality of semiconductor dies attached in a row to a corresponding strip of the lowermost metal layer 802 of the substrate 800, as previously described herein in connection with FIG. 15. Also different from the embodiment of FIG. 15, all of the semiconductor dies are attached at their respective insulated/isolated side to the same side of the substrate 800. The design of the substrate 800 is altered to bring all electrical connections out at the opposite side of the substrate 800 i.e. the side opposite the dies. Also, a first intermediary metal layer 804 of the substrate 804 forms the DC+ plane of the power semiconductor package and a second intermediary metal layer 806 of the substrate 800 forms the DC− plane of the power semiconductor package. The intermediary metal layers 804, 806 of the substrate 800 are insulated from one another and form the parallel plate waveguide. The same heatsink 808 can be attached to the insulated or isolated face of each semiconductor die, which faces away from the substrate 800 in this embodiment.

Figure 18:
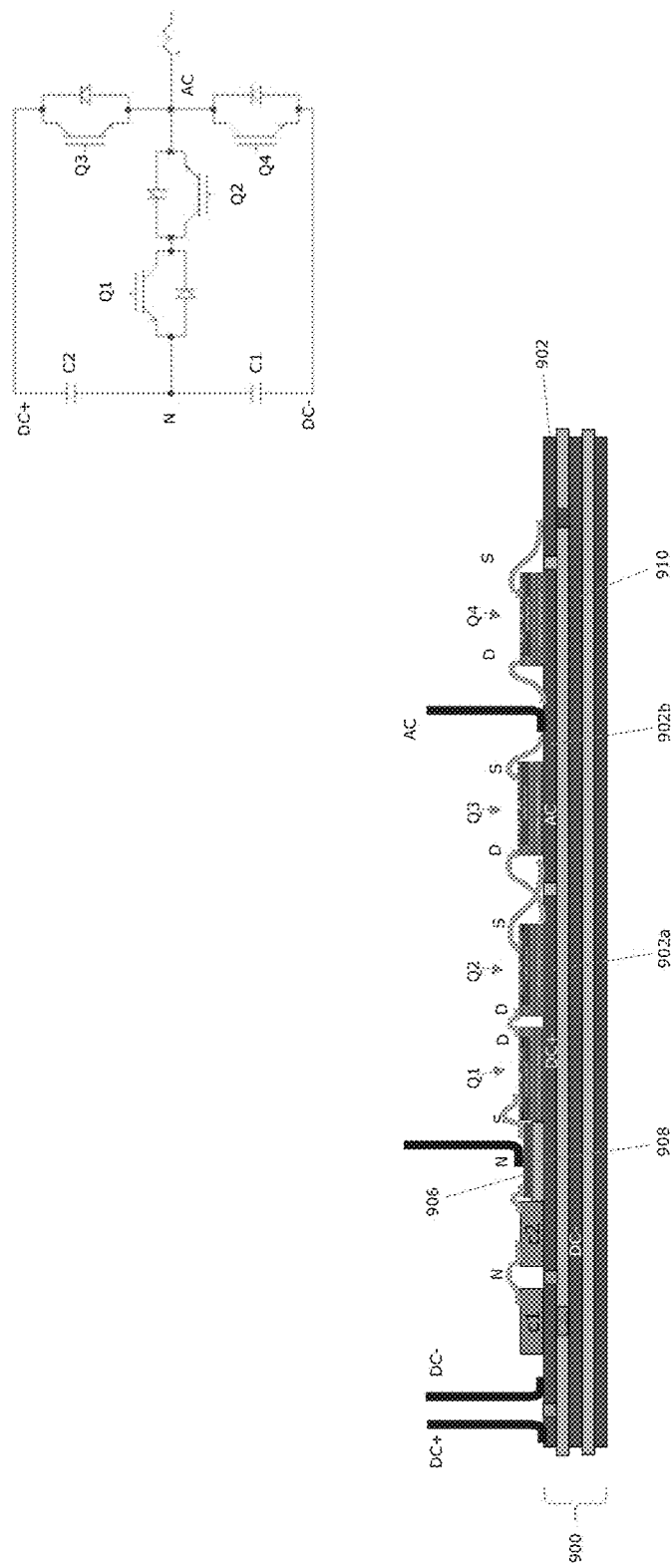
FIG. 18 illustrates a sectional view of a tenth embodiment of a power semiconductor package.

FIG. 18 illustrates an embodiment of a power semiconductor package which is similar to the embodiments shown in FIGS. 10 and 16. Different, however, is the circuit implemented. Instead of a single half bridge or 3-phase inverter, the package implements the 3-level converter schematically illustrated in FIG. 18. The 3-level converter has three input and output paths, depending on the controllable commutation paths implemented between the switches and diodes. This way, the AC terminal can be coupled to DC+, DC− or a midpoint level 'N'. The midpoint level 'N' is realized between two capacitors C1, C2 connected in series between the DC+ and DC− terminals. A first pair of series-connected devices Q1/Q2 provides a controllable path between midpoint level 'N' and the AC terminal. A second pair of series-connected devices Q3/Q4 provides a controllable path between either DC+ or DC− and the AC terminal. Each device Q1, Q2, Q3, Q4 shown in the circuit schematic is implemented by a plurality of semiconductor dies attached in a row to one strip 902a/902b of the uppermost metal layer 902 of the substrate 900. The semiconductor dies can include power MOSFETs (metal-oxide-semiconductor field effect transistors), IGBTs (insulated gate bipolar transistors, III-V power semiconductor transistors such as GaN transistors, etc. The transistor devices can be lateral or vertical devices.

The semiconductor dies that form device Q1 are attached to a first strip 902a of the uppermost metal layer 902 of the substrate 900 and evenly distributed over the width of the first strip 902a. The semiconductor dies that form device Q2 are attached to the same first metal strip 902a as the semiconductor dies that form device Q1, and are evenly distributed over the width of the first strip 902a. Each semiconductor die that forms device Q1 and each semiconductor die that forms device Q2 has an insulated or isolated face attached to the first metal strip 902a e.g. as previously described herein with respect to FIGS. 2-9. The semiconductor dies that form device Q1 are electrically connected in series to the semiconductor dies that form device Q2, as illustrated in the corresponding circuit schematic.

The semiconductor dies that form device Q3 are attached to a second strip 902b of the uppermost metal layer 902 of the substrate 900 and evenly distributed over the width of the second strip 902b. The semiconductor dies that form device Q4 are attached to the same second metal strip 902b as the semiconductor dies that form device Q3, and are evenly distributed over the width of the second strip 902b. Each semiconductor die that forms device Q1 and each semiconductor die that forms device Q2 has an insulated or isolated face attached to the second metal strip 902b e.g. as previously described herein with respect to FIGS. 2-9. The semiconductor dies that form device Q1 are electrically connected in series to the semiconductor dies that form device Q2, as illustrated in the corresponding circuit schematic.

The terminal for the midpoint level 'N' of the 3-level converter circuit is provided above the substrate 900 according to the embodiment illustrated in FIG. 18. More particularly, the terminal for the midpoint level 'N' is attached to an additional metal strip 906 disposed over and insulated from the first strip 902a of the uppermost metal layer 902 of the substrate 900. The additional metal strip 906 is disposed between capacitor C2 and the semiconductor dies that form device Q1, extends over the width of the first strip 902a, and is separated from the substrate 900 by an insulating layer 908. The parallel plate waveguide is formed by the uppermost metal layer 902 and intermediary metal layer 910 of the substrate 900 according to this embodiment.

Figure 19:
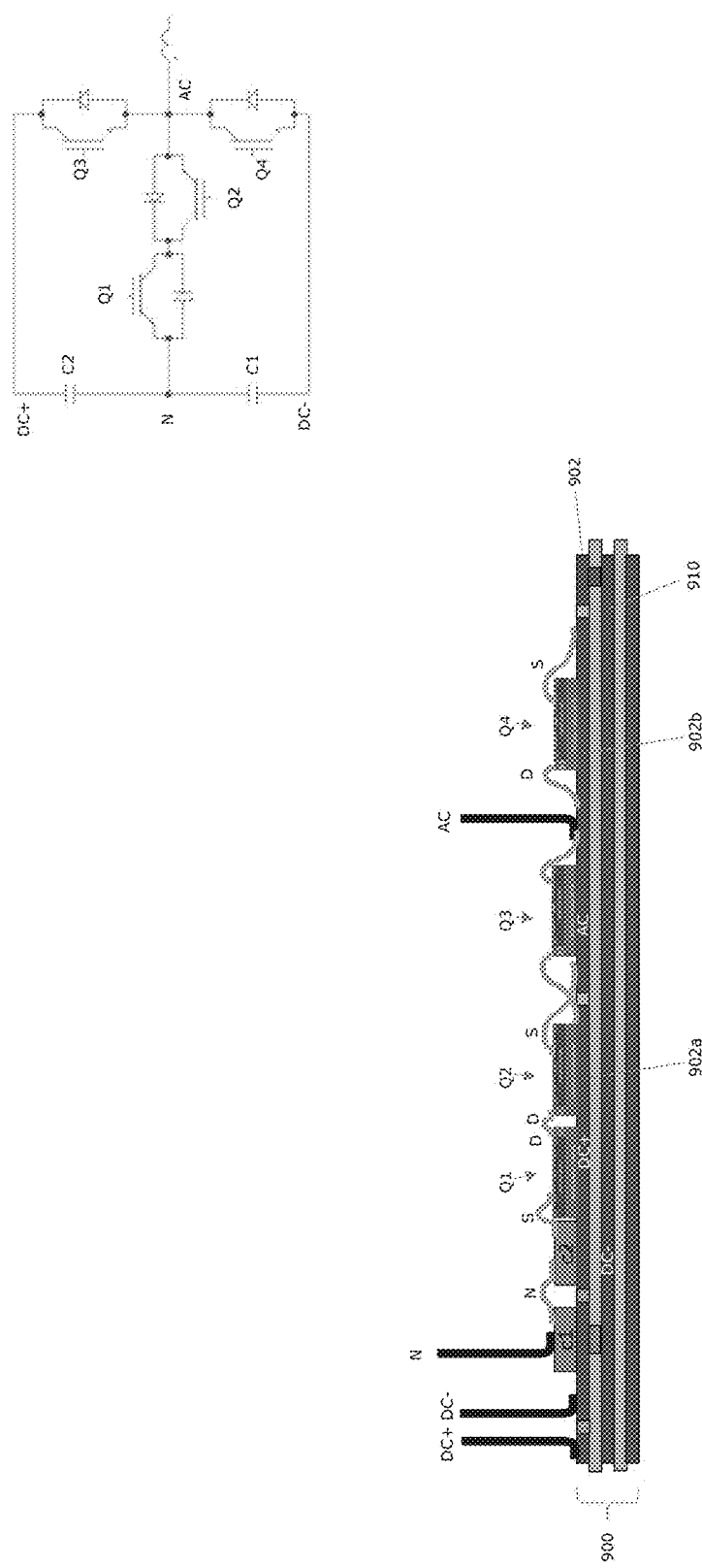
FIG. 19 illustrates a sectional view of an eleventh embodiment of a power semiconductor package.

FIG. 19 illustrates an embodiment of a power semiconductor package which is similar to the embodiment shown in FIG. 18. Different, however, the terminal for the midpoint level 'N' of the 3-level converter circuit is attached to the top terminal of capacitor C1.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor package, comprising:
a substrate comprising a lowermost metal layer, an uppermost metal layer, and an intermediary metal layer separated from the lowermost metal layer by a first insulating layer and separated from the uppermost metal layer by a second insulating layer, the uppermost metal layer being patterned into a plurality of strips which extend in parallel over a width of the substrate;
a first group of semiconductor dies attached to a first one of the strips of the uppermost metal layer and evenly distributed over the width of the first strip, each semiconductor die in the first group having an insulated or isolated face attached to the first strip;
a second group of semiconductor dies attached to the first strip of the uppermost metal layer and evenly distributed over the width of the first strip, each semiconductor die in the second group having an insulated or isolated face attached to the first strip;
a third group of semiconductor dies attached to a second one of the strips of the uppermost metal layer and evenly distributed over the width of the second strip, each semiconductor die in the third group having an insulated or isolated face attached to the second strip; and
a fourth group of semiconductor dies attached to the second strip of the uppermost metal layer and evenly distributed over the width of the second strip, each semiconductor die in the fourth group having an insulated or isolated face attached to the second strip, wherein the first group of semiconductor dies is electrically connected in series to the second group of semiconductor dies, wherein the third group of semiconductor dies is electrically connected in series to the fourth group of semiconductor dies.

2. The power semiconductor package of claim 1, further comprising:

a fifth group of semiconductor dies attached to a third one of the strips of the uppermost metal layer and evenly distributed over the width of the third strip, each semiconductor die in the fourth group having an insulated or isolated face attached to the third strip;

a sixth group of semiconductor dies attached to the third strip of the uppermost metal layer and evenly distributed over the width of the third strip, each semiconductor die in the fourth group having an insulated or isolated face attached to the third strip;

a first DC terminal attached to the third strip of the uppermost metal layer and evenly distributed over the width of the third strip; and a second DC terminal attached to a fourth one of the strips of the uppermost metal layer and evenly distributed over the width of the fourth strip, wherein the fifth group of semiconductor dies is electrically connected in series to the sixth group of semiconductor dies.

3. The power semiconductor package of claim 2, further comprising:

a first AC terminal attached to a first additional metal strip disposed over and insulated from the first strip of the uppermost metal layer of the substrate, the first additional metal strip being disposed between the first and the second groups of semiconductor dies and extending over a width of the first strip, the first AC terminal being evenly distributed over the width of the first additional metal strip;

a second AC terminal attached to a second additional metal strip disposed over and insulated from the second strip of the uppermost metal layer of the substrate, the second additional metal strip being disposed between the third and the fourth groups of semiconductor dies and extending over a width of the second strip, the second AC terminal being evenly distributed over the width of the second additional metal strip; and a third AC terminal attached to a third additional metal strip disposed over and insulated from the third strip of the uppermost metal layer of the substrate, the third additional metal strip being disposed between the fifth and the sixth groups of semiconductor dies and extending over a width of the third strip, the third AC terminal being evenly distributed over the width of the third additional metal strip.

4. The power semiconductor package of claim 1, wherein at least one of the first, second, third and fourth groups of semiconductor dies includes a plurality of vertical power transistor die in which current flows vertically through an active area of each vertical power transistor die between a source/emitter terminal and a drain/collector terminal of the vertical power transistor die, wherein the amount of current flow is controlled by a voltage applied to a gate terminal which is disposed at a front side of the vertical power transistor die, wherein the source/emitter terminal is disposed at the front side, wherein the drain/collector terminal is disposed at a backside of the active area, wherein an insulator covering a bottom side of the drain/collector terminal or a pn junction provides electrical isolation between the drain/collector terminal of the die and the uppermost metal layer of the package substrate.

5. The power semiconductor package of claim 4, wherein the drain/collector terminal of each vertical power transistor die is brought up to the front side of the die so that all electrical connections to the vertical power transistor die are made at the front side.

6. The power semiconductor package of claim 5, wherein the drain/collector terminal of each vertical power transistor die is brought up to the front side of the vertical power transistor die along at least two sides of the active area.

7. The power semiconductor package of claim 5, wherein a passivation layer at the front side of each vertical power transistor die isolates the terminals at the front side.

8. The power semiconductor package of claim 4, wherein the drain/collector terminal of each vertical power transistor die is contacted at a side of the active area.

9. The power semiconductor package of claim 1, wherein at least one of the first, second, third and fourth groups of semiconductor dies includes a plurality of lateral power transistor dies in which current flows laterally through an active area of each lateral power transistor die between a source/emitter terminal and a drain/collector terminal of the lateral power transistor die, wherein each terminal of the lateral power transistor die is formed at a front side of the lateral power transistor die which faces away from the substrate, and wherein an insulator covering a bottom side of the active area or a pn junction provides electrical isolation between the lateral power transistor die and the uppermost metal layer of the package substrate.

10. The power semiconductor package of claim 9, wherein a passivation layer at the front side of each die lateral power transistor isolates the terminals at the front side.

11. The power semiconductor package of claim 1, wherein at least one of the first, second, third and fourth groups of semiconductor dies includes a plurality of vertical power diode dies in which current flows vertically through an active area of each vertical power diode die between an anode terminal and a cathode terminal of the vertical power diode die, wherein an insulator covering a bottom side of the cathode terminal or a pn junction provides electrical isolation between the cathode terminal of the vertical power diode die and the uppermost metal layer of the package substrate.

12. The power semiconductor package of claim 11, wherein the cathode terminal of each vertical power diode die is brought up to a front side of the vertical power diode die so that all electrical connections to the vertical power diode die are made at the front side.

13. The power semiconductor package of claim 12, wherein the cathode terminal of each vertical power diode die is brought up to the front side of the vertical power diode die along at least two sides of the active area.

14. The power semiconductor package of claim 12, wherein a passivation layer at the front side of each vertical power diode die isolates the terminals at the front side.

15. The power semiconductor package of claim 11, wherein the cathode terminal of each vertical power diode die is contacted at a side of the active area.

16. The power semiconductor package of claim 1, wherein at least one of the first, second, third and fourth groups of semiconductor dies includes a plurality of vertical power diode dies in which current flows vertically through an active area of each vertical power diode die between an anode terminal and a cathode terminal of the vertical power diode die, wherein an insulator covering a bottom side of the anode terminal or a pn junction provides electrical isolation between the anode terminal of the vertical power diode die and the uppermost metal layer of the package substrate.

17. The power semiconductor package of claim 16, wherein the anode terminal of each vertical power diode die is brought up to a front side of the vertical power diode die so that all electrical connections to the vertical power diode die are made at the front side.

18. The power semiconductor package of claim 16, wherein a passivation layer at a front side of each vertical power diode die isolates the terminals at the front side.

* * * * *